United States Patent
Wang et al.

(10) Patent No.: US 12,346,030 B2
(45) Date of Patent: Jul. 1, 2025

(54) DEVICE AND METHOD FOR REGULATING AND CONTROLLING INCIDENT ANGLE OF LIGHT BEAM IN LASER INTERFERENCE LITHOGRAPHY

(71) Applicants: TSINGHUA UNIVERSITY, Beijing (CN); BEIJING U-PRECISION TECH CO., LTD., Beijing (CN)

(72) Inventors: Leijie Wang, Beijing (CN); Yu Zhu, Beijing (CN); Ming Zhang, Beijing (CN); Rong Cheng, Beijing (CN); Yuezhu Yang, Beijing (CN); Xin Li, Beijing (CN); Kaiming Yang, Beijing (CN)

(73) Assignees: TSINGHUA UNIVERSITY, Beijing (CN); BEIJING U-PRECISION TECH CO., LTD., Beijing (CN)

( * ) Notice: Subject to any disclaimer, the term of this patent is extended or adjusted under 35 U.S.C. 154(b) by 367 days.

(21) Appl. No.: 18/004,083

(22) PCT Filed: Jul. 1, 2021

(86) PCT No.: PCT/CN2021/103935
§ 371 (c)(1),
(2) Date: Mar. 31, 2023

(87) PCT Pub. No.: WO2022/002182
PCT Pub. Date: Jan. 6, 2022

(65) Prior Publication Data
US 2023/0280658 A1 Sep. 7, 2023

(30) Foreign Application Priority Data
Jul. 3, 2020 (CN) .......................... 202010636098.5

(51) Int. Cl.
*G03F 7/00* (2006.01)
*G01B 11/00* (2006.01)
(Continued)

(52) U.S. Cl.
CPC .......... *G03F 7/7055* (2013.01); *G01B 11/002* (2013.01); *G02B 26/0816* (2013.01);
(Continued)

(58) Field of Classification Search
CPC .................. G01B 11/002; G02B 26/0816; G02B 27/126; G03F 7/70025; G03F 7/7015;
(Continued)

(56) References Cited

U.S. PATENT DOCUMENTS

| | | | |
|---|---|---|---|
| 5,771,098 A | 6/1998 | Ghosh et al. | |
| 6,304,318 B1 | 10/2001 | Matsumoto | |
| 6,882,477 B1 | 4/2005 | Schattenburg et al. | |

FOREIGN PATENT DOCUMENTS

| | | |
|---|---|---|
| CN | 1731283 A | 2/2006 |
| CN | 103235489 A | 8/2013 |

(Continued)

OTHER PUBLICATIONS

Translation of CN 110806680, Feb. 18, 2020.*
(Continued)

*Primary Examiner* — Peter B Kim
(74) *Attorney, Agent, or Firm* — Shih IP Law Group, PLLC

(57) ABSTRACT

A device and a method for regulating and controlling an incident angle of a light beam in a laser interference lithography process are disclosed. The device comprises: a beam splitter prism between a first lens and a second lens, a first position detector, a first decoupling lens between the first position detector and the beam splitter prism, a feedback control system connected to the first position detector and a (Continued)

first universal reflecting mirror. The beam splitter prism reflects first incident light passing through the first universal reflecting mirror, the first decoupling lens enables a first reflected light enter into the first position detector, the first position detector measures the light beam position, the feedback control system outputs a control command according to the measurement result to regulate a mirror base of the first universal reflecting mirror, thereby regulating and controlling an incident angle of an exposure light beam.

9 Claims, 4 Drawing Sheets

(51) Int. Cl.
*G02B 26/08* (2006.01)
*G02B 27/12* (2006.01)
(52) U.S. Cl.
CPC ....... *G02B 27/126* (2013.01); *G03F 7/70025* (2013.01); *G03F 7/7015* (2013.01); *G03F 7/70208* (2013.01); *G03F 7/70408* (2013.01)
(58) Field of Classification Search
CPC ............. G03F 7/70208; G03F 7/70408; G03F 7/7055; G03F 7/70191; G03F 7/702
See application file for complete search history.

(56) References Cited

FOREIGN PATENT DOCUMENTS

| | | | |
|---|---|---|---|
| CN | 105242499 A | 1/2016 | |
| CN | 108983560 A | 12/2018 | |
| CN | 110806680 A | 2/2020 | |
| CN | 110837214 A | 2/2020 | |
| CN | 111812948 A | 10/2020 | |
| KR | 20190054764 A | * 5/2019 | ......... G03F 7/70408 |

OTHER PUBLICATIONS

Pages 31-32 and figure 2.15 of "Research on the Interference Fringe Static and Dynamic Phase-locking Technology in the Lithography System of the Holographic Grating" published on May 15, 2015 in No. 5 of "Medicine & Public Health, China Doctoral Dissertations Full-Text Database, Basic Science". Translated pp. 31-33.
International Search Report from International Application No. PCT/CN2021/103935 mailed Sep. 28, 2021.
Pages 31-32 and figure 15 of "Research on the Interference Fringe Static and Dynamic Phase-locking Technology in the Lithography System of the Holographic Grating" published on May 15, 2015 in No. 5 of "Medicine & Public Health, China Doctoral Dissertations Full-Text Database, Basic Science".

* cited by examiner

DEVICE AND METHOD FOR REGULATING AND CONTROLLING INCIDENT ANGLE OF LIGHT BEAM IN LASER INTERFERENCE LITHOGRAPHY

The present application claims the priority of the Chinese Patent Application No. 2020106360985, titled "device and method for regulating and controlling incident angle of light beam in laser interference lithography process" filed in China Patent Office on Jul. 3, 2020, the entire contents of which are incorporated into the present application by reference.

TECHNICAL FIELD

The present disclosure relates to a technical field of lithography technology, and more particularly, to a device and a method for regulating and controlling an incident angle of a light beam in a laser interference lithography process.

DESCRIPTION OF RELATED ART

Laser interference lithography technology is used to control an interference pattern by means of light beam combination using interference and diffraction characteristics of light, and has broad application prospects in fields of microelectronics, subwavelength gratings, microlens arrays, nanopattern manufacturing and the like. A period intercept of an interference grating pattern is directly determined by an incident angle of an exposure light path. In the dual-beam laser scanning interference lithography process for producing a variable period grating, precise measurement, regulating and controlling of the incident angle of the exposure light path is particularly important.

A US patent publication with a publication No. U.S. Pat. No. 6,882,477B1 discloses a solution for measuring, regulating and controlling an incident angle of an exposed light beam in a laser interference lithography system. In the solution, a spot position and an incident angle of a single beam exposure light path on the exposed substrate is calculated by eight signal sources of two position sensitive detectors, each light path is reflected by two dual-axis drive mirrors sequentially and then incident to the substrate, and four degrees of freedom of the light path comprising the position and the angle may be controlled by regulating through four drivers. Although the position and posture of the exposure optical path can be accurately measured, regulated and controlled by using this device, the structure of this device is relatively complex and needs to be regulated by two driving mirrors, and the structure of the optical path cannot be applied to the laser interference lithography system for producing the variable period grating.

SUMMARY

In view of the above problems, a purpose of the present disclosure is to provide a device and a method for regulating and controlling an incident angle of a light beam in a laser interference lithography process, so as to achieve accurate measurement, regulating and controlling of the incidence angle of the exposure light path in the variable period grating interference lithography system.

In order to achieve the above purpose, the present disclosure comprises the following technical solutions:

An aspect of the present disclosure is to provide a device and method for regulating and controlling an incident angle of a light beam in a laser interference lithography process, which is applied to a laser interference lithography system, the laser interference lithography system comprises a substrate, a first lens and a second lens facing each other, and a first universal reflecting mirror located at a focus of the first lens, wherein, the device for regulating and controlling an incident angle of a light beam comprises a beam splitter prism, a first decoupling lens, a first position detector and a feedback control system, wherein, the beam splitter prism is provided between the first lens and the second lens; the first decoupling lens is provided between the first position detector and the beam splitter prism, and the feedback control system is connected to the first position detector and the first universal reflecting mirror, wherein, the beam splitter prism is used for reflecting a first incident light passing through the first universal reflecting mirror, the first decoupling lens is used for enabling a first reflected light from the beam splitter prism to enter into the first position detector, the first position detector is used for measuring a position of the light beam and transmitting a measurement result to the feedback control system, and the feedback control system outputs a control command according to the measurement result to regulate a mirror base of the first universal reflecting mirror, thereby regulating and controlling an incidence angle of an exposure light beam, wherein, when a deflection angle of the interference fringe of the substrate is $\theta_e$, the measurement result of the position of the light beam measured by the first position detector is:

$$\Delta Lx = \frac{f_2 \lambda}{\sqrt{4P_t^2 - \lambda^2}}(1 - \cos\theta_e)$$

$$\Delta Ly = \frac{f_2 \lambda}{\sqrt{4P_t^2 - \lambda^2}}\sin\theta_e$$

wherein, $\Delta Lx$ represents an offset amount of the light beam in a x direction, $\Delta Ly$ represents an offset amount of the light beam in a y direction, $f_2$ represents a focal distance of the second lens, $P_t$ represents an intercept of an interference fringe at a time t, and $\lambda$ represents a laser wavelength.

Optionally, the laser interference lithography system further comprises a second universal reflecting mirror located at a focus of the first lens, and the device for regulating and controlling an incident angle of a light beam further comprises a second decoupling lens and a second position detector, wherein the second decoupling lens is provided between the second position detector and the beam splitting prism, and the feedback control system is further connected to the second position detector and the second universal reflecting mirror, the beam splitter prism is further used for reflecting a second incident light passing through a second universal reflecting mirror, the second decoupling lens is used for enabling a second reflected light from the beam splitter prism to enter into the second position detector, the second position detector is used for measuring a position of the light beam and transmitting a measurement result to the feedback control system, and the feedback control system outputs a control command according to the measurement result to regulate a mirror base of the second universal reflecting mirror, thereby regulating and controlling the incidence angle of the exposure light beam.

Optionally, the feedback control system comprises a signal receiver, a driver and a phase plate, the signal receiver is used for receiving the measurement result of the first position detector, the phase plate is used for calculating the measurement result, and the driver is used for sending a control command according to a calculation result to drive a movement of the mirror base of the first universal reflecting mirror.

Optionally, according to the measurement result, a regulating angle of the mirror base of the first universal reflecting mirror is:

$$\Delta\theta_x = \arctan\left(\frac{f_2\tan\left(\arcsin\left(\frac{\lambda}{2P_t}\right)\right) - \Delta Lx}{f_1}\right) - \arcsin\left(\frac{\lambda}{2P_t}\right)$$

$$\Delta\theta_y = \arctan\left(\frac{\Delta Ly}{f_1}\right)$$

wherein, $\Delta\theta_x$ represents a regulating angle in the x direction, $\Delta\theta_y$ represents a regulating angle in the y direction, $\Delta Lx$ represents the offset amount of the light beam in the x direction, $\Delta Ly$ represents the offset amount of the light beam in the y direction, $f_1$ represents a focal distance of the first lens, $f_2$ represents the focal distance of the second lens, $P_t$ represents the intercept of the interference fringe at the time t, and $\lambda$ represents the laser wavelength.

Optionally, when a target period intercept of the interference fringe of the substrate is $P_1$, the measurement result of the first position detector is:

$$\Delta L = f_2\tan\left(\arcsin\left(\frac{\lambda}{P_1}\right)\right) - f_2\tan\left(\arcsin\left(\frac{\lambda}{P_0}\right)\right)$$

wherein, $\Delta L$ represents the offset amount of the light beam, $P_1$ represents the target period intercept, $P_0$ represents an initial period intercept, $f_2$ represents the focal distance of the second lens, and $\lambda$ represents the laser wavelength.

Optionally, according to the measurement result, a regulating angle of the mirror base of the first universal reflecting mirror is:

$$\Delta\theta_x = \arctan\left(\frac{f_2\tan\left(\arcsin\left(\frac{\lambda}{2P_t}\right)\right) - \Delta L}{f_1}\right) - \arcsin\left(\frac{\lambda}{2P_t}\right)$$

wherein, $\Delta\theta_x$ represents a regulating angle of the mirror base in the x direction, $f_1$ represents a focal distance of the first lens, $f_2$ represents the focal distance of the second lens, $P_1$ represents the target period intercept, $\Delta L$ represents the offset amount of the light beam, and $\lambda$ represents the laser wavelength.

The present disclosure also provides a method for regulating and controlling incident angle of light beam in a laser interference lithography process, comprising following steps:
reflecting a first incident light passing through a first universal reflecting mirror by a beam splitter prism;
enabling a first reflected light from the beam splitter prism to enter into a first position detector by a first decoupling lens;
measuring a position of the light beam and transmitting a measurement result to a feedback control system by the first position detector; and
outputting a control command according to the measurement result by the feedback control system for regulating a mirror base of the first universal reflecting mirror, so as to regulate and control an incidence angle of an exposure light beam,
wherein, when a deflection angle of an interference fringe of a substrate is $\theta_e$, the measurement result of the position of the light beam measured by the first position detector is:

$$\Delta Lx = \frac{f_2\lambda}{\sqrt{4P_t^2 - \lambda^2}}(1 - \cos\theta_e)$$

$$\Delta Ly = \frac{f_2\lambda}{\sqrt{4P_t^2 - \lambda^2}}\sin\theta_e$$

wherein, $\Delta Lx$ represents an offset amount of the light beam in a x direction, $\Delta Ly$ represents an offset amount of the light beam in a y direction, $f_2$ represents a focal distance of a second lens, $P_t$ represents an intercept of an interference fringe at time t, and $\lambda$ represents a laser wavelength.

Optionally, the method further comprises the following steps:
reflecting the second incident light passing through the second universal reflecting mirror by the beam splitter prism;
enabling the second reflected light from the beam splitter prism to enter into the second position detector by a second decoupling lens;
measuring a position of the light beam, and transmitting a measurement result to the feedback control system by the second position detector; and
outputting a control command according to the measurement result by the feedback control system for regulating the mirror base of the second universal reflecting mirror, so as to regulate and control an incidence angle of an exposure light beam.

Optionally, the step of outputting a control command according to the measurement result by the feedback control system for regulating the mirror base of the first universal reflecting mirror comprises:
receiving the measurement result of the first position detector by a signal receiver, calculating the measurement result by a phase plate, and sending a control command according to a calculation result by a driver, so as to drive a movement of the mirror base of the first universal reflecting mirror.

Compared with the prior art, the present disclosure has the following advantages and beneficial effects:

In the present disclosure, the control command is calculated according to the measurement result of the first position detector, and the control command is sent to regulate and control the mirror base of the first universal reflecting mirror, so as to precisely regulating and controlling the incidence angle of the exposed light beam, so that an interference exposure can be generated on the substrate and an ideal interference pattern can be formed.

Moreover, the present disclosure can realize accurate regulating and controlling of the incident angle of the exposure light path in the variable period grating interference lithography system.

Figure 1A:
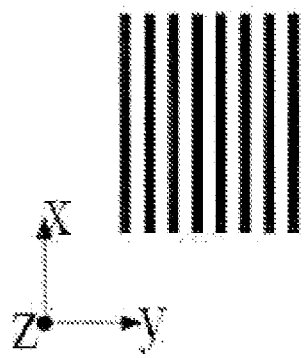
FIG. 1a is a schematic diagram of an ideal pattern of dual light beam interference at a standard incidence angle.

In the drawings: 1—laser, 2—first reflecting mirror, 3—grating beam splitter, 4—second reflecting mirror, 5—third reflecting mirror, 601—fourth reflecting mirror, 602—first universal reflecting mirror, 701—fifth reflecting mirror, 702—second universal reflecting mirror, 8—first lens, 9—second lens, 10—substrate, 11—beam splitting prism, 12—first decoupling lens, 13—first position detector, 14—second decoupling lens, 15—second position detector, 16—feedback control system.

DETAILED DESCRIPTIONS

The embodiments of the present disclosure will be described below with reference to the drawings. Those skilled in the art can recognize that the described embodiments can be modified in various ways or combinations thereof without departing from the spirit and scope of the present disclosure. Therefore, the drawings and descriptions are illustrative substantially and are not intended to limit the protection scope of the claims. In addition, in this specification, the drawings are not drawn in scale, and the same reference numerals represent the same portions.

Figure 2:
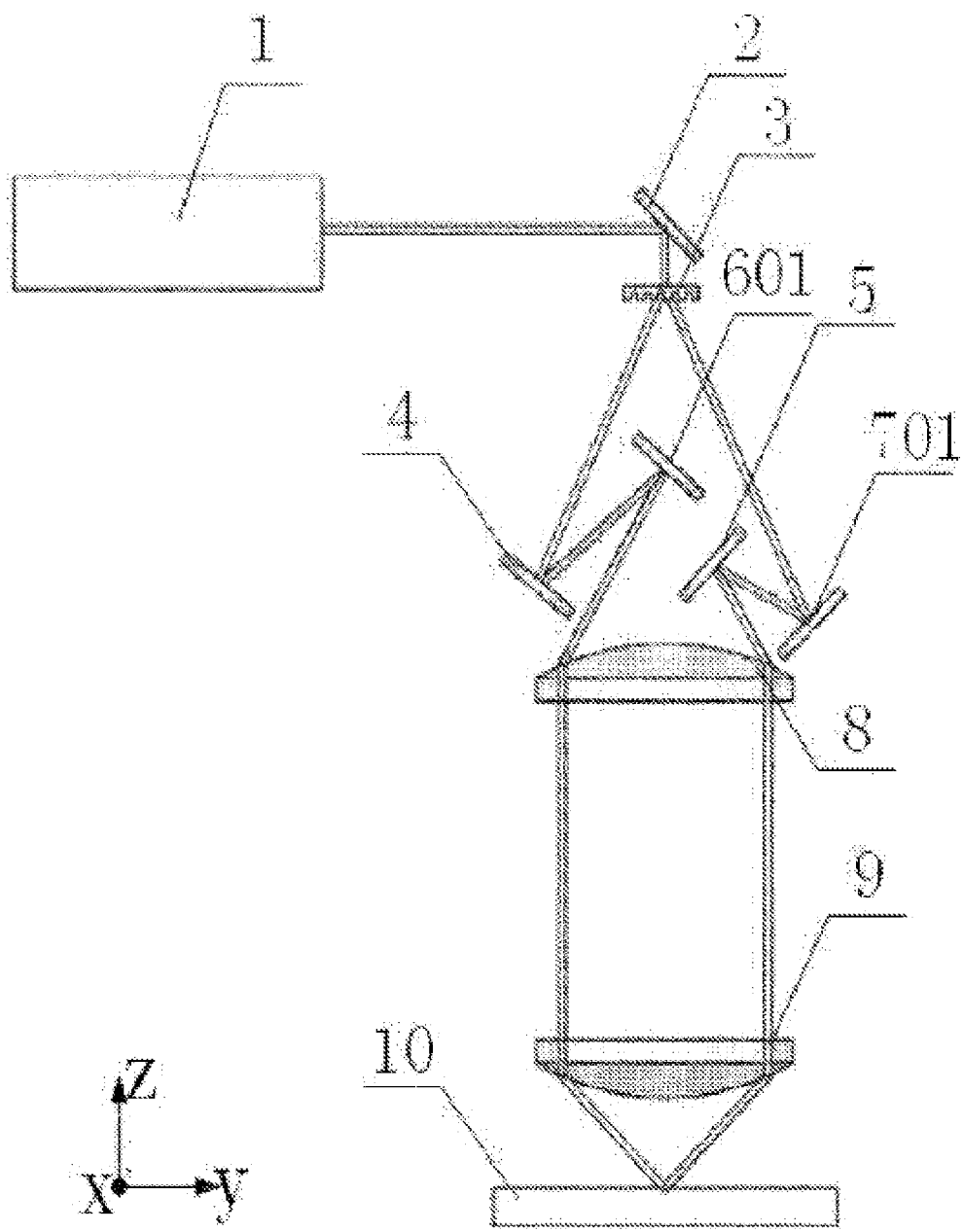
FIG. 2 is a schematic diagram of a conventional laser interference lithography system.

In the present disclosure, the device for regulating and controlling an incident angle of a light beam is applied to a laser interference lithography system. FIG. 2 is a schematic diagram of a conventional laser interference lithography system, and as shown in FIG. 2, the laser interference lithography system comprises: a laser 1, a first reflecting mirror 2, a grating beam splitter 3, a second reflecting mirror 4, a third reflecting mirror 5, a fourth reflecting mirror 601, a fifth reflecting mirror 701, a first lens 8, a second lens 9 and a substrate 10, wherein, the light source emitted by the laser 1 is divided into two exposure light paths after being incident to the grating beam splitter 3 by passing through the first reflecting mirror 2, the first exposure light path passes through the second reflecting mirror 4, the fourth reflecting mirror 601, the first lens 8 and the second lens 9 in sequence, and then is incident to the substrate 10 to form the first incident light. The second exposure light path passes through the fifth reflecting mirror 701, the third reflecting mirror 5, the first lens 8 and the second lens 9 in sequence, and then is incident to the substrate 10 to form the second incident light. The laser interference lithography system illustrated in FIG. 2 is not combined with the device for regulating and controlling the incident angle, and thereby cannot accurately measure, regulate or control the incident angle of the exposure light path.

Figure 3:
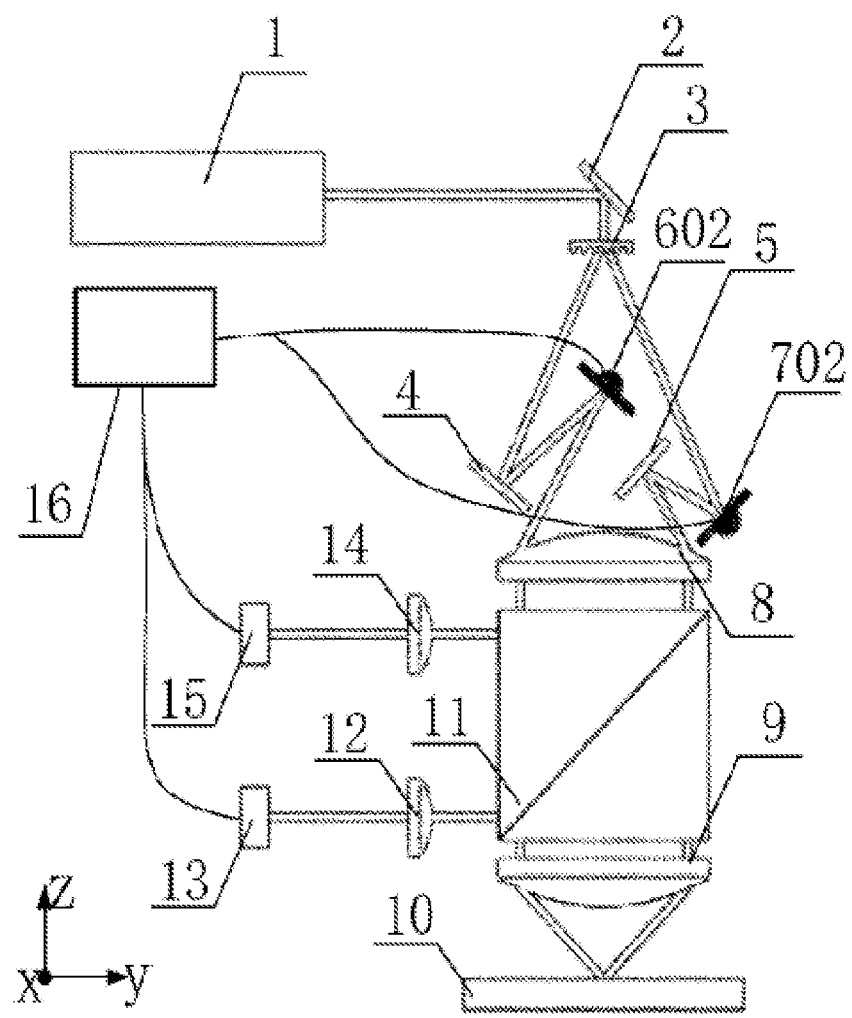
FIG. 3 is a schematic diagram of a laser interference lithography system in the present disclosure.

In the present disclosure, the conventional laser interference lithography system is improved. The laser interference lithography system of the present disclosure at least comprises a substrate 10, a first lens 8 and a second lens 9 facing each other, and a first universal reflecting mirror 602 located at a focus of the first lens 8. FIG. 3 is a schematic diagram of the laser interference lithography system in the present disclosure, and as shown in FIG. 3, the laser interference lithography system comprises a laser 1, a first reflecting mirror 2, a grating beam splitter 3, a second reflecting mirror 4, a third reflecting mirror 5, a first universal reflecting mirror 602, a second universal reflecting mirror 702, a first lens 8, a second lens 9 and a substrate 10, wherein the first universal reflecting mirror 602 and the second universal reflecting mirror 702 are located at the focus of the first lens 8, and the substrate 10 is located at the focus of the second lens 9. The light source emitted by the laser 1 is divided into two exposure light paths after being incident to the grating beam splitter 3 by passing through the first reflecting mirror 2, and the first exposure light path passes through the second reflecting mirror 4, the first universal reflecting mirror 602, the first lens 8 and the second lens 9 in sequence, and then is incident to the substrate 10 to form the first incident light. The second exposure light path passes through the second universal reflecting mirror 702, the third reflecting mirror 5, the first lens 8 and the second lens 9 in sequence, and then is incident to the substrate 10 to form the second incident light, and the exposure point is located at the focus of the second lens 9. Wherein, the first universal reflecting mirror 602 and the second universal reflecting mirror 702 are mounted on their mirror bases respectively, and the positions of the optical paths of the first universal reflecting mirror 602 and the second universal reflecting mirror 702 can be regulated by regulating the angle of the mirror base, so that the pattern of interference fringe formed on the substrate 10 can be regulated.

FIG. 3 also shows the device for regulating and controlling the incident angle of the light beam of the present disclosure, which is combined with the laser interference lithography system. Wherein, the device for regulating and controlling the incident angle of the light beam comprises a beam splitting prism 11, a first decoupling lens 12, a first position detector 13 (PSD) and a feedback control system 16, wherein the beam splitting prism 11 is provided between the first lens 8 and the second lens 9, the first decoupling lens 12 is provided between the first position detector 13 and the beam splitting prism 11, and the feedback control system 16 is connected to the first position detector 13 and the first universal reflecting mirror 602. Wherein, the beam splitting prism 11 is used for reflecting the first incident light passing through the first universal reflecting mirror 602, the first decoupling lens 12 is used for enabling the first reflected light from the beam splitter prism 11 to enter into the first position detector 13, the first position detector 13 is used for measuring the position of a light beam and transmitting the measurement result to the feedback control system 16, and the feedback control system 16 outputs the control command according to the measurement result to regulate the mirror base of the first universal reflecting mirror 602, thereby regulating and controlling the incidence angle of the exposed light beam. Wherein, the first exposure light path passes through the second reflecting mirror 4, the first universal reflecting mirror 602, the first lens 8, the beam splitting prism 11 and the second lens 9 in sequence, and then is incident to the substrate 10 to form the first incident light. When the light beam passes through the beam splitter prism 11, the light beam is reflected to the first decoupling lens 12 by the beam splitter prism 11, and then fed back to the feedback control system 16 by the first position detector 13.

In the present disclosure, a control command is calculated according to the measurement results of the first position detector 13, and the control command is sent to regulate and control the mirror base of the first universal reflecting mirror 602, so that the interference exposure can be generated on the substrate 10 and an ideal interference pattern can be formed.

In an embodiment of the present disclosure, the device for regulating and controlling the incident angle of the light beam further comprises a second decoupling lens 14 and a second position detector 15, wherein the second decoupling lens 14 is provided between the second position detector 15 and the beam splitting prism 11, and the feedback control system 16 is further connected to the second position detector 15 and the second universal reflecting mirror 702, the beam splitting prism 11 is further used for reflecting the second incident light passing through the second universal reflector 702, the second decoupling lens 14 is used for enabling the second reflected light from the beam splitter prism 11 to enter into the second position detector 15, the second position detector 15 is used for measuring the position of a light beam and transmitting the measurement result to the feedback control system 16, and the feedback control system 16 outputs the control command according to the measurement result to regulate the mirror base of the second universal reflecting mirror 702, so as to regulate the incidence angle of the exposed light beam.

In an embodiment, both of the first lens 8 and the second lens 9 are convex lenses. Both of the first decoupling lens 12 and the second decoupling lens 14 are convex lenses.

In an embodiment, the feedback control system 16 comprises a signal receiver, a driver and a phase plate. The signal receiver is used for receiving the measurement result of the first position detector 13 or the second position detector 15, and the phase plate is used for calculating the measurement result, the driver is used for sending a control command according to the calculate result to drive a movement of the mirror base of the first universal reflecting mirror 602 or the second universal reflecting mirror 702.

It should be noted that, in the present disclosure, the first position detector 13 measures the position of a light beam and the second position detector 15 measures the position of a light beam in the same way, and the feedback control system 16 also calculates the measurement result in the same way.

The embodiment of the present disclosure will be further explained by taking a single light beam as an example.

Figure 4:
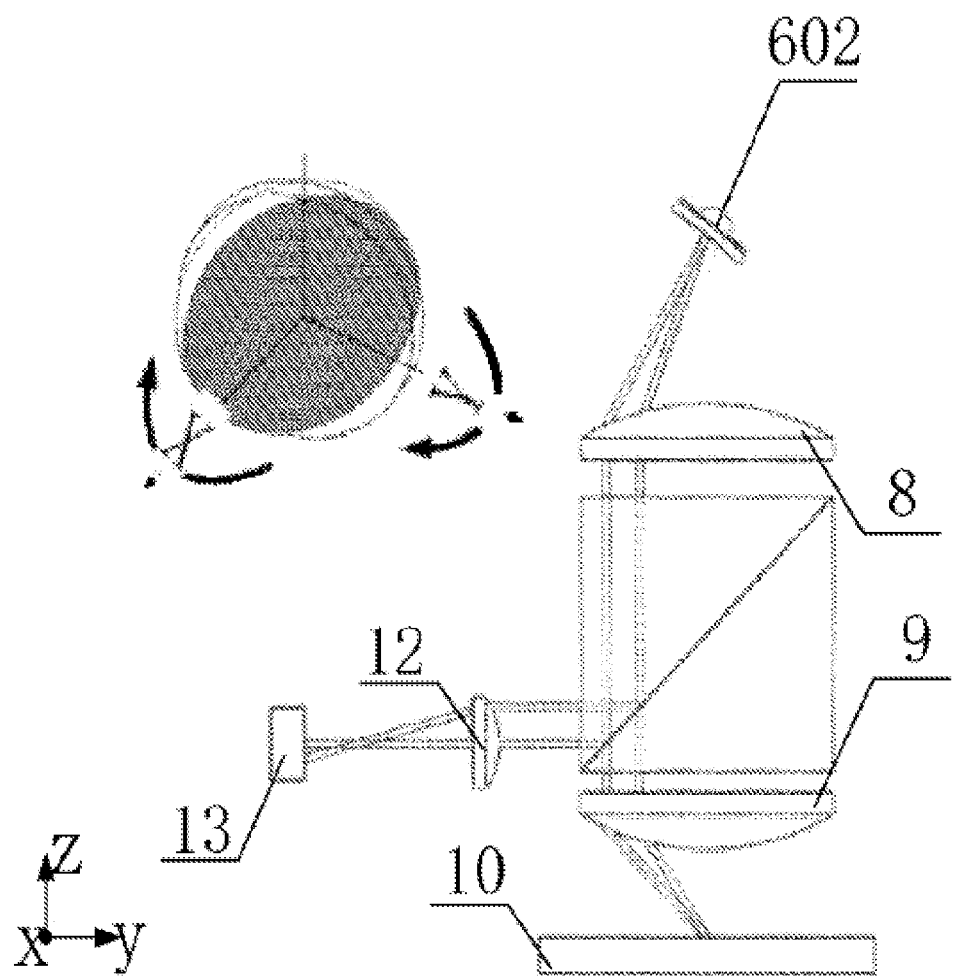
FIG. 4 is a principle diagram for regulating and controlling the incident angle of the exposure light beam in the laser interference lithography system in the present disclosure.

FIG. 4 is a principle diagram for regulating and controlling the incident angle of the exposure light beam in the laser interference lithography system in the present disclosure. As shown in FIG. 4, it is illustrated by taking the regulating of the first exposure optical path as an example, the first universal reflecting mirror 602 is located at the focal distance of the first lens 8, and the substrate 10 is located at the focal distance of the second lens 9, so that the measurement, the regulating and controlling of the incident angle of the exposed light beam can be converted into the measurement, the regulating and controlling of the position of the optical path between the first lens 8 and the second lens 9. In FIG. 4, the lower left is the coordinate system of the interference fringe, and the upper left is the coordinate system for regulating the mirror base of the first universal reflecting mirror 602.

Figure 1B:
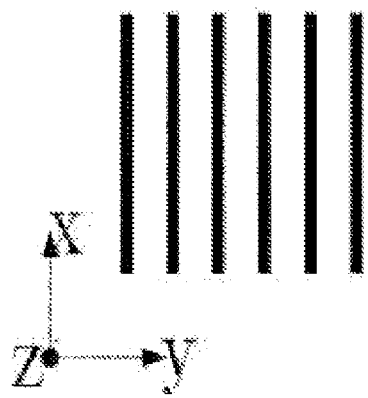
FIG. 1b is a schematic diagram of a pattern in which the incident angle has an angle deviation around the x axis and the fringe intercept deviates from the ideal value.
Figure 1C:
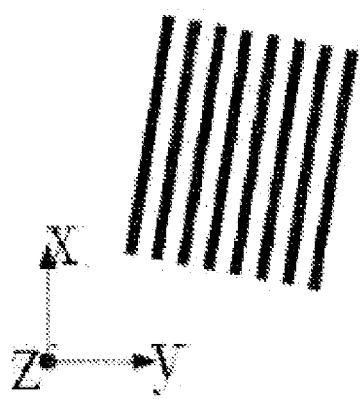
FIG. 1c is a schematic diagram of a pattern in which the incident angle has an angle deviation around the y axis and the fringe direction deviates from the ideal direction.

FIG. 1a a schematic diagram of an ideal pattern of dual light beam interference at the standard incidence angle, and FIG. 1c is a schematic diagram of a pattern in which the incident angle has an angle deviation around the y axis and the fringe direction deviates from the ideal direction. As shown in FIG. 1a and FIG. 1c, when a deflection angle of the interference fringe of the substrate 10 is $\theta_e$, the measurement result of the position of a light beam measured by the first position detector 13 is:

$$\Delta Lx = \frac{f_2 \lambda}{\sqrt{4P_t^2 - \lambda^2}}(1 - \cos\theta_e)$$

$$\Delta Ly = \frac{f_2 \lambda}{\sqrt{4P_t^2 - \lambda^2}}\sin\theta_e$$

wherein, $\Delta Lx$ represents the offset amount of the light beam in the x direction, $\Delta Ly$ represents the offset amount of the light beam in the y direction, $f_2$ represents the focal distance of the second lens, $P_t$ represents the intercept of the interference fringe at a time t, and $\lambda$ represents the laser wavelength.

Furthermore, according to the measurement result, the regulating angle of the mirror base of the first universal reflecting mirror 602 is:

$$\Delta\theta_x = \arctan\left(\frac{f_2\tan\left(\arcsin\left(\frac{\lambda}{2P_t}\right)\right) - \Delta Lx}{f_1}\right) - \arcsin\left(\frac{\lambda}{2P_t}\right)$$

$$\Delta\theta_y = \arctan\left(\frac{\Delta Ly}{f_1}\right)$$

wherein, $\Delta\theta_x$ represents the regulating angle in the x direction, $\Delta\theta_y$ represents the regulating angle in the y direction, $\Delta Lx$ represents the offset amount of the light beam in the x direction, $\Delta Ly$ represents the offset amount of the light beam in the y direction, $f_1$ represents the focal distance of the first lens, $f_2$ represents the focal distance of the second lens, $P_t$ represents the intercept of the interference fringe at the time t, and $\lambda$ represents the laser wavelength.

By regulating the mirror base of the first universal reflecting mirror 602, the direction of the interference fringe can be regulated to be the same as that of the ideal interference fringe.

In the dual light beam laser interference lithography system for producing gradient periodic grating, the deviation of the incident direction of the exposed light beam may cause the interference pattern to deviate from the ideal pattern. FIG. 1a is a schematic diagram of the ideal pattern of dual light beam interference at the standard incidence angle, and FIG. 1b is a schematic diagram of a pattern in which the incident angle has an angle deviation around the x axis and the fringe intercept deviates from the ideal value. As shown in FIG. 1a and FIG. 1b, the period intercept of the interference fringe formed at the substrate 10 deviates from the period intercept under the ideal state. In one embodiment, when the target period intercept of the interference fringe of the substrate 10 is $P_1$ (ideal period intercept), the measurement result of the first position detector 13 is:

$$\Delta L = f_2\tan\left(\arcsin\left(\frac{\lambda}{P_1}\right)\right) - f_2\tan\left(\arcsin\left(\frac{\lambda}{P_0}\right)\right)$$

Wherein, $\Delta L$ represents the offset amount of the light beam, $P_1$ represents the target period intercept, $P_0$ represents the initial period intercept (actually formed period intercept deviated from ideal state), $f_2$ represents the focal distance of the second lens, and $\lambda$ represents the laser wavelength.

Furthermore, according to the measurement result, the regulating angle of the mirror base of the first universal reflecting mirror 602 is:

$$\Delta\theta_x = \arctan\left(\frac{f_2\tan\left(\arcsin\left(\frac{\lambda}{2P_t}\right)\right) - \Delta L}{f_1}\right) - \arcsin\left(\frac{\lambda}{2P_t}\right)$$

Wherein, $\Delta\theta_x$ represents the regulating angle of the mirror base in the x direction, $f_1$ represents the focal distance of the first lens, $f_2$ represents the focal distance of the second lens, $P_1$ represents the target period intercept, $\Delta L$ represents the offset amount of the light beam, and $\lambda$ represents the laser wavelength.

It should be noted that, in the formula of the measurement result of the first position detector 13 and the calculation formula of the regulating angle of the mirror base of the first universal mirror 602, all the variables adopted are represented by vectors, and the fringe deflection direction and the regulating direction of the mirror base are included therein, so as to accurately regulate the mirror base according to the fringe deflection direction.

It should be noted that when a plurality of light beams are adopted for interference, the calculation formula of the measurement result or the regulating angle of the second position detector 15 and the mirror base of the second universal reflecting mirror 702 are the same as the above.

After obtaining the regulating angle of the mirror base of the first universal mirror 602, the measurement result of the first position detector 13 is calculated by the phase plate in the feedback control system 16, and according to the calculation result, the driver connected by the back plate of the VME housing sends a control command to drive the mirror base of the first universal reflecting mirror 602 to precisely regulate the incidence angle of the light beam, and thereby forming an ideal interference pattern.

The effects of regulating and controlling the incidence angle of the light beam of the laser interference lithography system by using the device for regulating and controlling incident angle of the present disclosure will be described in detail below. In the laser interference lithography system, the measurement error caused by PSD electronic noise is the biggest factor that affects the error of the measurement result of the incidence angle of the light beam. The error caused by the PSD electronic noise is presented as the minimum measurement resolution of PSD. Taking the psd9 product of Xinou Optoelectronics as an example, its photosensitive chip has a measurement distance of 9 mm, and its resolution can reach 1.5 μm under the condition that the incident light wavelength is 633 nm and the power is 3 mW, it can be seen that the signal-to-noise ratio is 6e+3 at this case; the experimental conditions are optical wavelength of 355 nm, power of 0.1 mW, and the sensitivity of this type of product at wavelengths of 633 nm and 355 nm are 38.5% and 16.3% respectively. Under this experimental conditions, the signal-to-noise ratio is 6e+3*(16.3%*0.5)/(38.5%*3)=84.68, and the current resolution is 21.26 μm which is calculated according to the total measurement distance of 9 mm.

The relationship between PSD measurement displacement s and light beam offset $\delta L$ is:

$$s = (1 - L_1/f_3)\delta L$$

In the formula, $L_1$ is the distance parameter of PSD from the decoupling lens. In the process of compensating the fringe direction, the measurement error of PSD will cause the motor driving angle regulating angle ($\delta\theta y$) calculated from the measurement result (i.e. light beam offset information) to be inaccurate; $f_3$ represents the focal distance of the decoupling lens (herein, the decoupling lens in particular may be the first decoupling lens or the second decoupling lens in the system).

The relationship between the fringe direction deflection angle $\delta\theta$ and the light beam offset $\delta L$ is:

$$\delta\theta = \operatorname{asin}\left(\frac{\tan(2*\delta\theta y)*f_1}{L}\right)$$

$$\delta\theta y = -\left(\frac{\operatorname{atan}\left(\frac{\delta L}{f_1}\right)}{2}\right)$$

Wherein, L represents the distance from the center of the light beam to the optical axis of the first lens, atan is the abbreviation of arctangent function arctan, $f_1$ is the focal distance of the first lens, and $\delta\theta y$ is the motor driving angle regulating angle.

The fringe direction deflection angle error et caused by PSD measurement error $\varepsilon$ is:

$$et = \delta\theta y(s+\varepsilon) - \delta\theta y(s)$$

Wherein, $\varepsilon$ is the measurement error parameter of PSD, and the fringe direction deflection angle error et calculated by simulation is 54.55 urad; s is the measurement displacement of PSD; and $\delta\theta y$ is the motor driving angle regulating angle.

The relationship between fringe period intercept P and light beam offset $\delta L$ is:

$$P = \frac{\lambda}{2\sin\left(\operatorname{atan}\left(\frac{\delta L + f_2\tan\theta}{f_2}\right)\right)}$$

Wherein, P is the fringe period intercept, $\delta L$ is the light beam offset, $\lambda$ is the laser wavelength, and $f_2$ is the focal distance of the second lens.

The fringe period intercept error ep caused by PSD measurement error $\varepsilon$ is:

$$ep = P(s+\varepsilon) - \delta\theta y(s)$$

Wherein, P is the fringe period intercept, s is the measurement displacement of PSD, $\varepsilon$ is the measurement error parameter of PSD, and $\delta\theta y$ is the motor driving angle regulating angle.

Because the period error being a cumulative error, the error value is relatively large at the later stage of the step. The set cycle range is 500 nm to 2500 nm, the period step interval is 10 nm, and the period error at the edge of the substrate is about 22 nm, that is, 22 nm deviated from the standard value of 2500 nm.

The present disclosure also provides a method for regulating and controlling an incident angle of a light beam in a laser interference lithography process, which is used in the laser interference lithography system to regulate and control the incidence angle of the light beam, the method comprises the following steps.

reflecting a first incident light passing through a first universal reflecting mirror 602 by a beam splitter prism 11;

enabling a first reflected light from the beam splitter prism 11 to enter into a first position detector 13 by a first decoupling lens 12;

measuring a position of the light beam and transmitting a measurement result to a feedback control system 16 by the first position detector 13; and outputting a control command according to the measurement result by the feedback control system 16, for regulating the mirror base of the first universal reflecting mirror 602, so as to regulate and control the incidence angle of the exposure light beam.

In one embodiment, the method further comprises the following steps:

reflecting the second incident light passing through the second universal reflecting mirror 702 by the beam splitter prism 11;

enabling the second reflected light from the beam splitter prism 11 to enter into the second position detector 15 by a second decoupling lens 14;

measuring a position of the light beam 15 and transmitting a measurement result to a feedback control system 16 by the second position detector; and outputting a control command according to the measurement result by the feedback control system 16, for regulating the mirror base of the second universal reflecting mirror 702, so as to regulate and control the incidence angle of the exposure light beam.

In the present disclosure, the light beam is reflected by the beam splitter prism 11, the position of a light beam is measured by the first position detector 13 and the second position detector 15, and the measurement result is feeds back to the feedback control system 16, and the mirror base is regulated by the feedback control system 16, so that the incidence angle of the light beam can be accurately regulated and controlled.

In one embodiment, the step of outputting a control command according to the measurement result by the feedback control system 16 for regulating the mirror base of the first universal reflecting mirror 602 comprises:

receiving the measurement result of the first position detector 13 by a signal receiver, calculating the measurement result by the phase plate, and sending a control command according to the calculation result by the driver, so as to drive a movement of the mirror base of the first universal reflecting mirror 602.

It should be noted that the specific embodiment of the method for regulating and controlling incident angle of light beam in a laser interference lithography process of the present disclosure is the same as the specific embodiment of the above device for regulating and controlling incident angle of light beam.

The above content is only preferred embodiments of the present disclosure and is not intended to limit the present disclosure. For those skilled in the art, the present disclosure can be made various changes and variations. Any modification, equivalent replacement, improvement, etc. made within the spirit and principle of the present disclosure shall be included in the protection scope of the present disclosure.

What is claimed is:

1. A device for regulating and controlling an incident angle of a light beam in a laser interference lithography process, which is applied to a laser interference lithography system, the laser interference lithography system comprises a substrate, a first lens and a second lens facing each other, and a first universal reflecting mirror located at a focus of the first lens, wherein, the device for regulating and controlling an incident angle of a light beam comprises a beam splitter prism, a first decoupling lens, a first position detector and a feedback control system, wherein, the beam splitter prism is provided between the first lens and the second lens, the first decoupling lens is provided between the first position detector and the beam splitter prism, and the feedback control system is connected to the first position detector and the first universal reflecting mirror, wherein, the beam splitter prism is used for reflecting a first incident light passing through the first universal reflecting mirror, the first decoupling lens is used for enabling a first reflected light from the beam splitter prism to enter into the first position detector, the first position detector is used for measuring a position of the light beam and transmitting a measurement result to the feedback control system, and the feedback control system outputs a control command according to the measurement result to regulate a mirror base of the first universal reflecting mirror, thereby regulating and controlling an incidence angle of an exposure light beam, wherein, when a deflection angle of an interference fringe of the substrate is $\theta_e$, the measurement result of the position of the light beam measured by the first position detector is:

$$\Delta Lx = \frac{f_2 \lambda}{\sqrt{4P_t^2 - \lambda^2}}(1 - \cos\theta_e)$$

$$\Delta Ly = \frac{f_2 \lambda}{\sqrt{4P_t^2 - \lambda^2}}\sin\theta_e$$

wherein, $\Delta Lx$ represents an offset amount of the light beam in a x direction, $\Delta Ly$ represents an offset amount of the light beam in a y direction, $f_2$ represents a focal distance of the second lens, $P_t$ represents an intercept of an interference fringe at a time t, and $\lambda$ represents a laser wavelength.

2. The device for regulating and controlling an incident angle of a light beam in a laser interference lithography process according to claim 1, wherein the laser interference lithography system further comprises a second universal reflecting mirror located at the focus of the first lens, and the device for regulating and controlling an incident angle of a light beam further comprises a second decoupling lens and a second position detector, wherein the second decoupling lens is provided between the second position detector and the beam splitting prism, and the feedback control system is further connected to the second position detector and the second universal reflecting mirror, the beam splitter prism is further used for reflecting a second incident light passing through the second universal reflecting mirror, the second decoupling lens is used for enabling a second reflected light from the beam splitter prism to enter into the second position detector, the second position detector is used for measuring a position of the light beam and transmitting a measurement result to the feedback control system, and the feedback control system outputs a control command according to the measurement result to regulate a mirror base of the second universal reflecting mirror, thereby regulating and controlling the incidence angle of the exposure light beam.

3. The device for regulating and controlling an incident angle of a light beam in a laser interference lithography process according to claim 1, wherein the feedback control system comprises a signal receiver, a driver and a phase plate, the signal receiver is used for receiving the measurement result of the first position detector, the phase plate is used for calculating the measurement result, and the driver is used for sending a control command according to a calculation result to drive a movement of the mirror base of the first universal reflecting mirror.

4. The device for regulating and controlling an incident angle of a light beam in a laser interference lithography process according to claim 1,
wherein, according to the measurement result, a regulating angle of the mirror base of the first universal reflecting mirror is:

$$\Delta\theta_x = \arctan\left(\frac{f_2\tan\left(\arcsin\left(\frac{\lambda}{2P_t}\right)\right) - \Delta Lx}{f_1}\right) - \arcsin\left(\frac{\lambda}{2P_t}\right)$$

$$\Delta\theta_y = \arctan\left(\frac{\Delta Ly}{f_1}\right)$$

wherein, $\Delta\theta_x$ represents a regulating angle in the x direction, $\Delta\theta_y$ represents a regulating angle in the y direction, $\Delta Lx$ represents the offset amount of the light beam in the x direction, $\Delta Ly$ represents the offset amount of the light beam in the y direction, $f_1$ represents a focal distance of the first lens, $f_2$ represents the focal distance of the second lens, $P_t$ represents the intercept of the interference fringe at the time t, and $\lambda$ represents the laser wavelength.

5. The device for regulating and controlling an incident angle of a light beam in a laser interference lithography process according to claim 1,
wherein, when a target period intercept of the interference fringe of the substrate is $P_1$, the measurement result of the first position detector is:

$$\Delta L = f_2\tan\left(\arcsin\left(\frac{\lambda}{P_1}\right)\right) - f_2\tan\left(\arcsin\left(\frac{\lambda}{P_0}\right)\right)$$

wherein, $\Delta L$ represents the offset amount of the light beam, $P_1$ represents the target period intercept, $P_0$ represents an initial period intercept, $f_2$ represents the focal distance of the second lens, and $\lambda$ represents the laser wavelength.

6. The device for regulating and controlling an incident angle of a light beam in a laser interference lithography process according to claim 5,
wherein, according to the measurement result, a regulating angle of the mirror base of the first universal reflecting mirror is:

$$\Delta\theta_x = \arctan\left(\frac{f_2\tan\left(\arcsin\left(\frac{\lambda}{2P_t}\right)\right) - \Delta L}{f_1}\right) - \arcsin\left(\frac{\lambda}{2P_t}\right)$$

wherein, $\Delta\theta_x$ represents a regulating angle of the mirror base in the x direction, $f_1$ represents a focal distance of the first lens, $f_2$ represents the focal distance of the second lens, $P_1$ represents the target period intercept, $\Delta L$ represents the offset amount of the light beam, and $\lambda$ represents the laser wavelength.

7. A method for regulating and controlling an incident angle of a light beam in a laser interference lithography process, comprising the following steps:
reflecting a first incident light passing through a first universal reflecting mirror by a beam splitter prism;
enabling a first reflected light from the beam splitter prism to enter into a first position detector by a first decoupling lens;
measuring a position of the light beam and transmitting a measurement result to a feedback control system by the first position detector; and
outputting a control command according to the measurement result by the feedback control system for regulating a mirror base of the first universal reflecting mirror, so as to regulate and control an incidence angle of an exposure light beam,
wherein, when a deflection angle of an interference fringe of a substrate is $\theta_e$, the measurement result of the position of the light beam measured by the first position detector is:

$$\Delta Lx = \frac{f_2\lambda}{\sqrt{4P_t^2 - \lambda^2}}(1 - \cos\theta_e)$$

$$\Delta Ly = \frac{f_2\lambda}{\sqrt{4P_t^2 - \lambda^2}}\sin\theta_e$$

wherein, $\Delta Lx$ represents an offset amount of the light beam in a x direction, $\Delta Ly$ represents an offset amount of the light beam in a y direction, $f_2$ represents a focal distance of a second lens, $P_t$ represents an intercept of an interference fringe at time t, and $\lambda$ represents a laser wavelength.

8. The method for regulating and controlling an incident angle of a light beam in a laser interference lithography process according to claim 7, wherein, the method further comprises the following steps:
reflecting a second incident light passing through a second universal reflecting mirror by the beam splitter prism;
enabling a second reflected light from the beam splitter prism to enter into the second position detector by a second decoupling lens;
measuring a position of the light beam and transmitting a measurement result to the feedback control system by the second position detector; and
outputting a control command according to the measurement result by the feedback control system for regulating the mirror base of the second universal reflecting mirror, so as to regulate and control an incidence angle of an exposure light beam.

9. The method for regulating and controlling an incident angle of a light beam in a laser interference lithography process according to claim 7, wherein, the step of outputting a control command according to the measurement result by the feedback control system for regulating the mirror base of the first universal reflecting mirror comprises:
receiving the measurement result of the first position detector by a signal receiver, calculating the measurement result by a phase plate, and sending a control command according to a calculation result by a driver, so as to drive a movement of the mirror base of the first universal reflecting mirror.

* * * * *